(12) United States Patent
Iizuka et al.

(10) Patent No.: US 8,796,558 B2
(45) Date of Patent: Aug. 5, 2014

(54) BASE OF SURFACE-MOUNT ELECTRONIC COMPONENT PACKAGE, AND SURFACE-MOUNT ELECTRONIC COMPONENT PACKAGE

(75) Inventors: Minoru Iizuka, Kakogawa (JP); Yuka Kojo, Kakogawa (JP)

(73) Assignee: Daishinku Corporation, Kakogawa-shi (JP)

( * ) Notice: Subject to any disclaimer, the term of this patent is extended or adjusted under 35 U.S.C. 154(b) by 177 days.

(21) Appl. No.: 13/497,831

(22) PCT Filed: Mar. 24, 2011

(86) PCT No.: PCT/JP2011/057204
§ 371 (c)(1),
(2), (4) Date: Mar. 23, 2012

(87) PCT Pub. No.: WO2011/125519
PCT Pub. Date: Oct. 13, 2011

(65) Prior Publication Data
US 2013/0098654 A1     Apr. 25, 2013

(30) Foreign Application Priority Data
Apr. 1, 2010 (JP) .................................. 2010-085232

(51) Int. Cl.
*H05K 5/00* (2006.01)
(52) U.S. Cl.
USPC ............. 174/260; 174/50.5; 174/50; 174/250
(58) Field of Classification Search
CPC .......................... H05K 5/0091; H05K 5/0095
USPC .................................. 174/50.5, 50, 250, 260
See application file for complete search history.

(56) References Cited

U.S. PATENT DOCUMENTS

2009/0174291 A1   7/2009  Nagano et al.

FOREIGN PATENT DOCUMENTS

| JP | 2002-076813 A | 3/2002 |
|---|---|---|
| JP | 2005-108923 A | 4/2005 |
| JP | 2006-005027 A | 1/2006 |
| JP | 2006-032645 A | 2/2006 |
| JP | 2009-188374 A | 8/2009 |
| JP | 2009-188375 A | 8/2009 |
| JP | 2009-224741 A | 10/2009 |
| WO | WO 2009/025320 A1 | 2/2009 |

*Primary Examiner* — Timothy Thompson
*Assistant Examiner* — Charles Pizzuto
(74) *Attorney, Agent, or Firm* — Marvin A. Motsenbocker; Mots Law, PLLC

(57) ABSTRACT

A base of a surface-mount electronic component package holds an electronic component element and is to be mounted on a circuit board with a conductive bonding material. The base has a principal surface and an external connection terminal to be electrically connected to the circuit board. The external connection terminal is formed in the principal surface. The base includes a bump formed on the external connection terminal. The bump is smaller than the external connection terminal. The base has a distance d between an outer periphery end edge of the external connection terminal and an outer periphery end edge of the bump along an attenuating direction of stress on the external connection terminal The stress is generated in association of mounting of the base on the circuit board. The distance d is more than 0.00 mm and equal to or less than 0.45 mm.

11 Claims, 7 Drawing Sheets

BASE OF SURFACE-MOUNT ELECTRONIC COMPONENT PACKAGE, AND SURFACE-MOUNT ELECTRONIC COMPONENT PACKAGE

TECHNICAL FIELD

The present invention relates to a base of a surface-mount electronic component package, and a surface-mount electronic component package.

BACKGROUND ART

Surface-mount electronic component packages (hereinafter referred to as "packages") are applicable to electronics devices and the like, specifically to surface-mount piezoelectric resonator devices (hereinafter referred to as "piezoelectric resonator devices") such as crystal resonators, crystal filters, and crystal oscillators.

A piezoelectric resonator device includes a crystal resonator plate with metal film electrodes on both principal surfaces of the crystal resonator plate. The crystal resonator plate is disposed in a package. The package hermetically seals the metal film electrodes to protect the metal film electrodes from ambient air. Piezoelectric resonator devices of this kind generally have packages made of ceramic material in view of demands associated with surface mounting of parts (see, for example, Patent Citation PLT 1).

PLT 1 discloses a surface-mount resonator as a piezoelectric resonator device. The surface-mount resonator includes a base (referred to as "a mounting board" in PLT 1) made of ceramic material and a lid (referred to as "a cover" in PLT 1). The casing of the surface-mount resonator is composed of a rectangular parallelepiped shaped package. In the internal space of the package, a piezoelectric resonator piece (referred to as "a quartz crystal piece" in PLT 1) is held and bonded on the base. The package with the piezoelectric resonator piece held and bonded therein is bonded on a circuit board made of glass epoxy material with a solder, thus electrically connecting the circuit board to an external connection terminal formed on the base.

CITATION LIST

Patent Literature

PLT 1: Japanese Unexamined Patent Application Publication No. 2002-76813.

SUMMARY OF INVENTION

Technical Problem

With the technique described in PLT 1, the base is bonded on the circuit board with a solder. Unfortunately, the circuit board (a glass epoxy material) and the base (a ceramic material) have a difference in coefficients of thermal expansion. This causes heat fatigue and/or a creep that in turn cause a solder crack during the mounting of the base on the circuit board. The solder crack causes a problem of electrical disconnection between the base and the circuit board. The solder crack, as used herein, occurs along the external connection terminal formed on the base.

The present invention has been made to solve the above-described problems, and it is an object of the present invention to provide a package and a base of the package that improve the durability of the solder and minimize the electrical disconnection of the package from the circuit board.

Solution to Problem

In order to achieve the above-described object, according to one aspect of the present invention, a base holds an electronic component element and is to be mounted on a circuit board with a conductive bonding material. The base has a principal surface and at least one external connection terminal to be electrically connected to the circuit board. The at least one external connection terminal is formed in the principal surface. The base includes a bump formed on the at least one external connection terminal The bump is smaller than the at least one external connection terminal. The base has a distance d between an outer periphery end edge of the at least one external connection terminal and an outer periphery end edge of the bump along an attenuating direction of stress on the at least one external connection terminal The stress is generated in association of mounting of the base on the circuit board. The stress attenuates along the attenuating direction of stress. The distance d is more than 0.00 mm and equal to or less than 0.45 mm.

With this aspect of the present invention, the external connection terminal to be electrically connected to the circuit board with the conductive bonding material is formed in the principal surface. The bump that is smaller than the external connection terminal is formed on the external connection terminal. The distance d along the attenuating direction of stress is more than 0.00 mm and equal to or less than 0.45 mm. This improves the durability of the conductive bonding material and minimizes the electrical disconnection of the package from the circuit board.

Specifically, with this aspect of the present invention, forming the bump on the external connection terminal ensures that even if a crack occurs on the conductive bonding material, the crack on the conductive bonding material does not develop along the external connection terminal of the base, but instead develops from an outer periphery end edge of the external connection terminal toward an outer periphery end edge of the bump. Thus, a bending point is ensured where the crack is bent in its course. The bending point impedes the advancement of a crack itself. This aspect of the present invention also ensures that even if a crack occurs on the conductive bonding material, the electrical disconnection of the base from the circuit board is more securely minimized as compared with the conventional art without the bump. This, as a result, improves the durability of the conductive bonding material. This configuration ensures that the distance of positive-negative reversal of the direction of strain is extended to equal to or more than 1.5 times as compared with the conventional art without the bump. This, as a result, reduces the rate of crack advancement on the conductive bonding material.

In the above configuration, the distance d may be more than 0.00 mm and equal to or less than 0.12 mm.

This configuration, in which the distance d is more than 0.00 mm and equal to or less than 0.12 mm, eliminates the positive-negative reversal of strain. This minimizes the advancement of a crack on the conductive bonding material, which would otherwise advance due to the positive-negative reversal of strain. It is particularly preferred that the distance d is 0.12 mm, in which case the positive-negative reversal of strain is eliminated, and a long distance d is ensured.

In the above configuration, the distance d may be equal to or more than 0.06 mm and equal to or less than 0.45 mm.

This configuration keeps the Maximum von Mises Stress at equal to or less than 5.00E+11 Pa, and the reduction in Maximum von Mises Stress minimizes the amount of cracks. In particular, the Maximum von Mises Stress is minimized at a distance d of 0.12 mm.

In the above configuration, the distance d may be equal to or more than 0.06 mm and equal to or less than 0.12 mm.

This configuration, in which the distance d is equal to or more than 0.06 mm and equal to or less than 0.12 mm, eliminates the positive-negative reversal of strain. This minimizes the advancement of a crack on the conductive bonding material, which would otherwise advance due to the positive-negative reversal of strain. Additionally, the Maximum von Mises Stress is kept at equal to or less than 5.00E+11 Pa, and the reduction in Maximum von Mises Stress minimizes the amount of cracks. In particular, strain and the Maximum von Mises Stress are minimized at a distance d of 0.12 mm.

In the above configuration, an imaginary line may pass on the outer periphery end edge of the at least one external connection terminal and the outer periphery end edge of the bump, and an angle of the imaginary line relative to a surface of the at least one external connection terminal may be in a range of 8° to 18°.

This configuration, in which the angle of the imaginary line relative to a surface of the external connection terminal is in a range of 8° to 18°, eliminates the positive-negative reversal of strain. This minimizes the advancement of a crack on the conductive bonding material, which would otherwise advance due to the positive-negative reversal of strain.

In the above configuration, the at least one external connection terminal may include four external connection terminals respectively formed at four corners of the principal surface. The attenuating direction of stress on each of the four external connection terminals may be oriented from each of the four corners of the principal surface toward a center point of the principal surface. The present invention is applicable to a four-terminal configuration that includes the four external connection terminals formed at the respective four corners of the principal surface.

In the above configuration, the at least one external connection terminal may include a pair of opposing external connection terminals formed along a pair of respective sides of the principal surface. The attenuating direction of stress on each of the pair of external connection terminals may be oriented from a corner portion of each of the external connection terminals closest to a corner of the principal surface toward a side of each of the external connection terminals closest to a center point of the principal surface. The present invention is applicable to a two-terminal configuration that includes the pair of opposing external connection terminals formed along a pair of respective sides of the principal surface.

In the above configuration, the at least one external connection terminal may include a pair of external connection terminals formed at respective diagonal positions of the principal surface. The attenuating direction of stress on each of the pair of external connection terminals may be oriented from a corner portion of each of the external connection terminals disposed at a corner of the principal surface toward a diagonal portion of each of the external connection terminals disposed at a diagonal position relative to the corner portion.

This configuration, in which a pair of external connection terminals are disposed diagonally on the principal surface of the base, ensures that even if a difference in coefficients of thermal expansion exists between the base and the circuit board, the base rotates about the center point of the principal surface to uniformly distribute the stress.

In the above configuration, the bump may have a thickness increasing along the attenuating direction of stress.

This configuration, in which the thickness of the bump increases along a direction in which the stress attenuates, causes a crack to develop along a surface of the bump. This ensures that even if a crack occurs on the conductive bonding material, the electrical disconnection of the base from the circuit board is more securely minimized as compared with the conventional art without the bump. This, as a result, improves the durability of the conductive bonding material.

In the above configuration, the base and the circuit board may have different coefficients of thermal expansion.

In this configuration, in which the base and the circuit board have different coefficients of thermal expansion, a crack is likely to occur on the conductive bonding material. Still, this configuration ensures that even if a crack occurs on the conductive bonding material, the electrical disconnection of the base from the circuit board is more securely minimized as compared with the conventional art without the bump. This, as a result, improves the durability of the conductive bonding material.

In order to achieve the above-described object, according to another aspect of the present invention, a package to be mounted on a circuit board includes the base of the one aspect of the present invention to hermetically seal an electronic component element, and a lid.

With this aspect of the present invention, the package includes the base of the one aspect of the present invention and the lid, and the package is to be mounted on the circuit board. This improves the durability of the conductive bonding material and minimizes the electrical disconnection of the package from the circuit board.

Specifically, with this aspect of the present invention, forming the bump on the external connection terminal ensures that even if a crack occurs on the conductive bonding material, the crack on the conductive bonding material does not develop along the external connection terminal of the base, but instead develops from an outer periphery end edge of the external connection terminal toward an outer periphery end edge of the bump. Thus, a bending point is ensured where the crack is bent in its course. The bending point impedes the advancement of a crack itself. This aspect of the present invention also ensures that even if a crack occurs on the conductive bonding material, the electrical disconnection of the base from the circuit board is more securely minimized as compared with the conventional art without bumps. This, as a result, improves the durability of the conductive bonding material. This configuration ensures that the distance of positive-negative reversal of the direction of strain is extended to equal to or more than 1.5 times as compared with the conventional art without bumps. This, as a result, reduces the rate of crack advancement on the conductive bonding material.

Advantageous Effects of Invention

The present invention improves the durability of the solder and minimizes the electrical disconnection of the package from the circuit board.

DESCRIPTION OF EMBODIMENTS

Embodiments of the present invention will be described below by referring to the accompanying drawings. In the following embodiments, the present invention is applied to a crystal resonator as a surface-mount piezoelectric resonator device. The crystal resonators according to the embodiments are applicable to electronic devices in automotive applications that assume severe, high and low temperature environments, and in particular, applicable to principal electronic devices such as ECUs (Engine Control Units).

Figure 1:
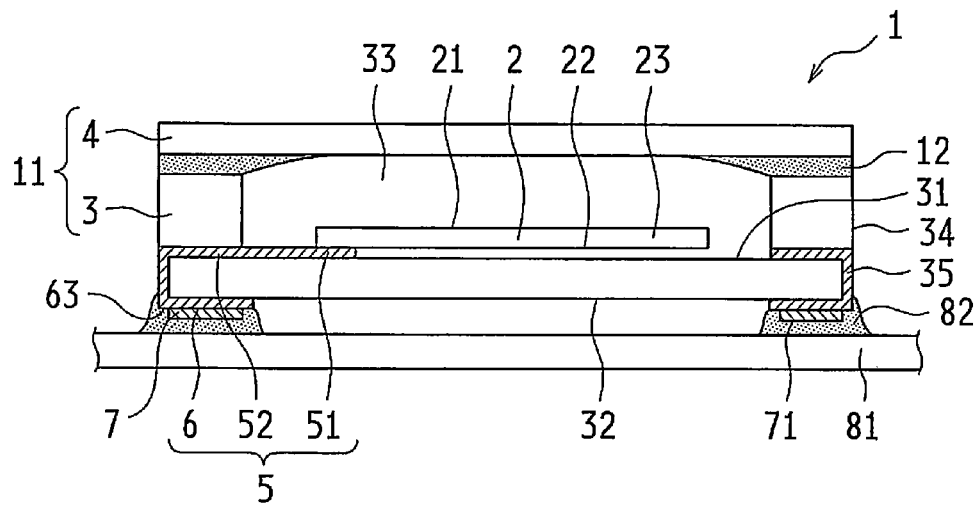
FIG. 1 is a schematic diagram illustrating an internal space of a crystal resonator mounted on a circuit board according to an embodiment of the present invention.

As shown in FIG. 1, a crystal resonator 1 according to this embodiment includes: a crystal resonator piece 2 (a piezoelectric resonator piece) made of AT-cut quartz crystal; a base 3 (a part of a package 11) holding the crystal resonator piece 2 to hermetically seal the crystal resonator piece 2; and a lid 4 (a part of a package 11) hermetically sealing the crystal resonator piece 2 held on the base 3.

In the crystal resonator 1, the base 3 and the lid 4 define a package 11. The base 3 and the lid 4 are bonded to one another with a bonding material 12 to define a hermetically sealed internal space. In the internal space, the crystal resonator piece 2 is electrically and mechanically bonded to the base 3 with a conductive bonding material (not shown). Examples of the conductive bonding material used include a conductive resin adhesive, a metal bump, a metallic plating bump, and a brazing filler metal.

Next, the constituents of the crystal resonator 1 will be described by referring to FIGS. 1 to 3.

—Base 3—

The base 3 is made of a ceramic material (e.g., an alumina ceramic material). As shown in FIG. 1, the base 3 has a box-shaped body that includes a bottom portion and a bank portion that extends upward from the bottom portion along an outer periphery of one principal surface 31 of the base 3. The base 3 is made of a rectangular parallelepiped ceramics that is integrally fired on a single ceramic plate into the form of a depression, with an opening on top.

The bank portion of the base 3 has a top face that is a bonding face for the lid 4. A sealing material of glass (see reference numeral 12 in FIG. 1) is formed on the top face. The base 3 has a cavity 33 surrounded by the bottom portion and the bank portion. The crystal resonator piece 2 is disposed in the cavity 33.

Figure 2:
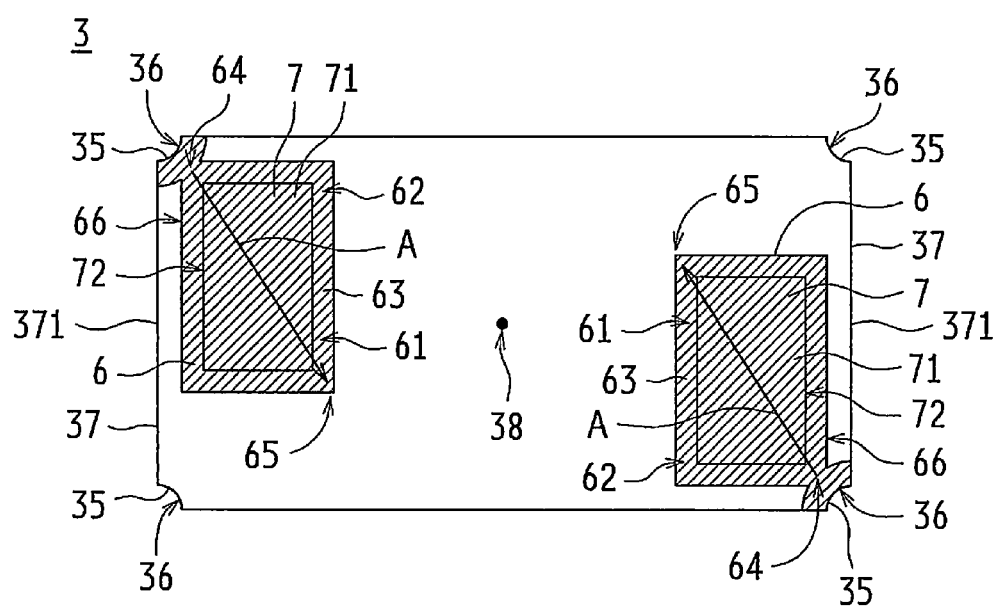
FIG. 2 is a schematic rear view of the package according to this embodiment of the present invention.

As shown in FIGS. 1 and 2, castellations 35 are formed on side faces 34 of the base 3. The castellations 35 are disposed at respective four corners 36 of the other principal surface 32, which is the reverse face of the base 3. In each of the castellations 35, a wiring pattern 52 (see below) is formed from the side face 34 to the other principal surface 32 (at a lower side of each of each castellation 35) as shown in FIG. 1.

As shown in FIG. 1, the base 3 includes two electrode pads 51 electrically and mechanically bonded respectively to excitation electrodes (not shown) of the crystal resonator piece 2. The base 3 further includes: two external connection terminals 6 that are electrically connected to the circuit board 81; and the wiring patterns 52 that respectively establish electrical continuity from the two electrode pads 51 to the two external connection terminals 6. The electrode pads 51, the external connection terminals 6, and the wiring patterns 52 constitute an electrode 5 of the base 3. The electrode pad 51 is formed on the one principal surface 31 of the base 3. The external connection terminal 6 is formed on the other principal surface 32 of the base 3. The wiring pattern 52 is formed on the one principal surface 31, on the other principal surface 32, and on the castellations 35 of the base 3. The electrode pad 51, the external connection terminal 6, and the wiring pattern 52 each include a metallized film of tungsten, molybdenum, or the like, and a layer of Ni plating and a layer of Au plating that are disposed on the top face of the metallized film.

As shown in FIG. 2, the two external connection terminals 6 are formed on diagonal positions among the four corners 36 of the other principal surface 32 of the base 3. The two external connection terminals 6 are identically shaped in the form of a rectangular parallelepiped (3.2×2.5×0.85 mm). The two external connection terminals 6 have opposing areas 61 that face each other in the longer side direction and non-opposing areas 62 that do not face each other in the longer side direction. The two external connection terminals 6 are disposed symmetrically relative to the center point 38 of the other principal surface 32 of the base 3, with the non-opposing areas 62 disposed at the respective corners 36 of the other principal surface 32, and the opposing areas 61 disposed adjacent to a center position 371 of each of a pair of shorter sides 37 of the other principal surface 32. As shown in FIGS. 1 to 3, bumps 7 each including a metallized film of tungsten, molybdenum, or the like are formed on the external connection terminals 6. Each bump 7 is shaped similarly to the external connection terminal 6 with a slightly smaller plane area than the plane area of the external connection terminal 6. In this embodiment, each bump 7 is shaped similarly to the external connection terminal 6 such that the bump 7 has a diagonal line in plan view that is approximately 0.2 mm shorter than a diagonal line of the external connection terminal 6. This results in the bump 7 being disposed within the external connection terminal 6 when the bump 7 is superposed on the external connection terminal 6. A surface 63 of the external connection terminal 6 and a surface 71 of the bump 7 are flat and oriented in the same direction as the direction (same surface direction) in which the other principal surface 32 of the base 3 is oriented.

—Lid 4—

As shown in FIG. 1, the lid 4 is made of a ceramic material (e.g., an alumina ceramic material) and is in the form of a rectangular parallelepiped single plate that is rectangular in plan view. On the bottom face of the lid 4, a sealing material such as a glass sealing material (see reference numeral 12 in FIG. 1) for bonding the lid 4 to the base 3 is formed. The internal space is hermetically sealed by a method such as fusion bonding with the lid 4 on the base 3 disposed in a heating furnace of inert gas. Thus, the package 11 of the crystal resonator 1 is defined by the lid 4 and the base 3.

—Crystal Resonator Piece 2—

The crystal resonator piece 2 is a substrate made of a AT-Cut quartz crystal piece, and has an outer shape in the form of a rectangular parallelepiped plate as shown in FIG. 1.

The crystal resonator piece 2 includes: a pair of excitation electrodes (not shown) for effecting excitation; a pair of terminal electrodes (not shown) electrically and mechanically bonded to the electrode pad 51 of the base 3; and leading-out electrodes (not shown) leading out the pair of excitation electrodes to the pair of terminal electrodes.

The pair of excitation electrodes is formed on both principal surfaces 21 and 22 to face each other. The pair of excitation electrodes are each made of, for example, a Cr—Au film, which includes a Cr layer and an Au layer that are stacked in the order set forth starting on the substrate. The pair of terminal electrodes are formed on the other principal surface 22, and each made of, for example, a Cr—Au film, which includes a Cr layer and an Au layer that are stacked in the order set forth starting on the substrate, similarly to the excitation electrode. The leading-out electrodes are formed on both principal surfaces 21 and 22 and on a side face 23 without facing one another. The leading-out electrodes are each made of, for example, a Cr—Au film, which includes a Cr layer and an Au layer that are stacked in the order set forth starting on the substrate, similarly to the excitation electrode.

In the crystal resonator 1 thus configured, the base 3 and the crystal resonator piece 2 are electrically and mechanically bonded to one another with a conductive bonding material. This bonding electrically and mechanically bonds the excitation electrodes of the crystal resonator piece 2 to the electrode pads 51 of the base 3 via the leading-out electrodes, the terminal electrodes, and the conductive bonding material, thus mounting the crystal resonator piece 2 on the base 3. Then the lid 4 is disposed over the base 3 on which the crystal resonator piece 2 is mounted, and the sealing material (see reference numeral 12 in FIG. 1) electrically and mechanically bonds the base 3 to the lid 4. Thus, the crystal resonator 1 with the crystal resonator piece 2 hermetically sealed therein is fabricated.

Figure 3:
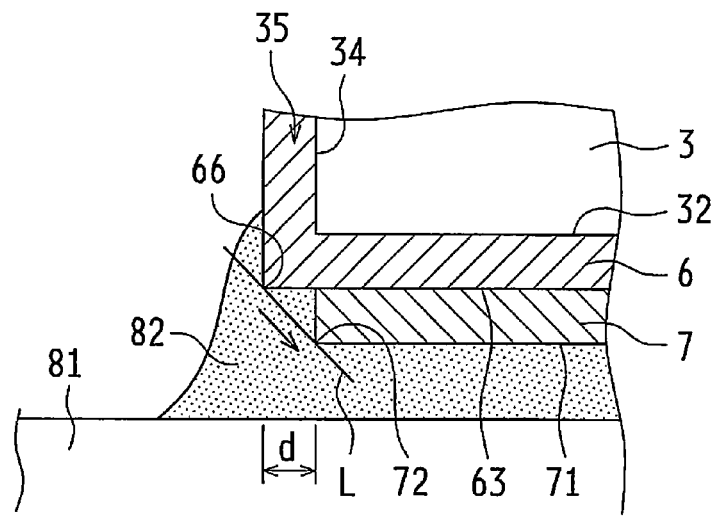
FIG. 3 is an enlarged view of the circuit board and the crystal resonator shown in FIG. 1, illustrating a state of their bonding.

The crystal resonator 1 with the crystal resonator piece 2 hermetically sealed is mounted on the circuit board 81, and then bonded to the circuit board 81 with a solder 82 (conductive bonding material) as shown in FIGS. 1 and 3. Thus, the external connection terminals 6 formed on the base 3 are electrically connected to the circuit board 81.

Incidentally, the bonding of the crystal resonator 1 on the circuit board 81 causes strain on the solder in the thickness direction.

In the case of the crystal resonator 1 shown in FIG. 1, strain-causing stress is at a high level at a corner portion 64 of the external connection terminal 6. The corner portion 64 is adjacent to the castellation 35, which is disposed at a corner 36 of the other principal surface 32 of the base 3. The stress attenuates along a direction from the corner portion 64 toward a diagonal portion 65 disposed at a diagonal position relative to the corner portion 64 (the direction in which the stress attenuates on the principal surface of the base 3 will be hereinafter referred to as "attenuating direction A of stress").

Figure 4:
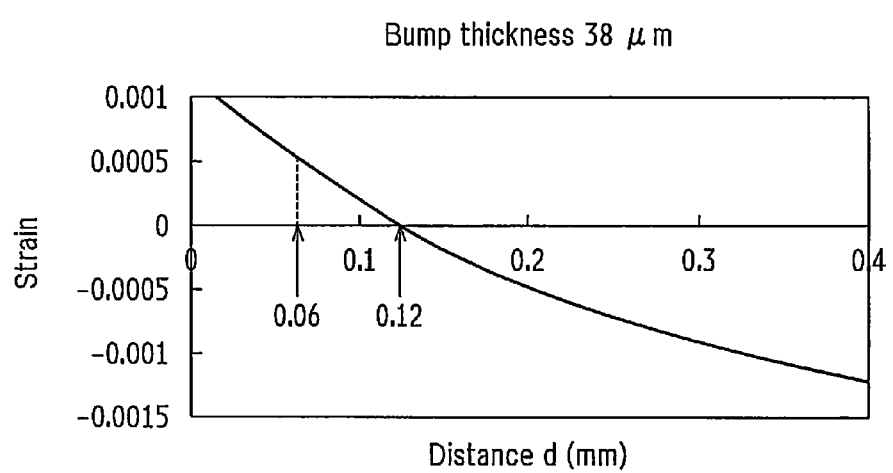
FIG. 4 is a graph illustrating a relationship between the distance d and the strain in the thickness direction at a bump thickness of 38 μm.
Figure 5:
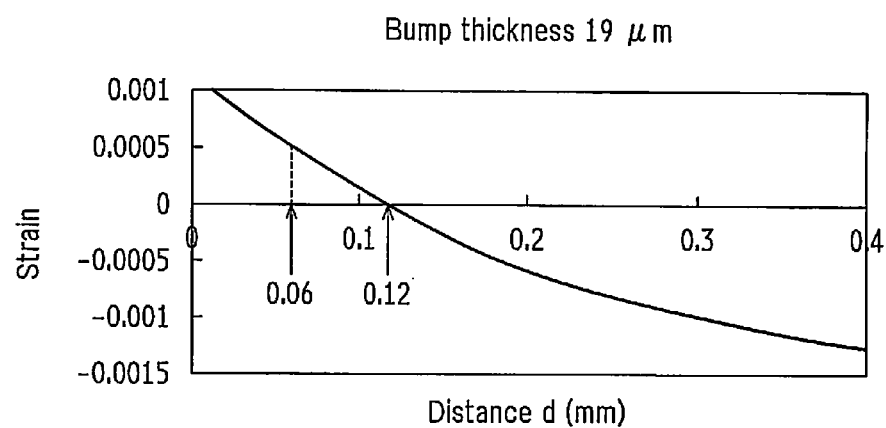
FIG. 5 is a graph illustrating a relationship between the distance d and the strain in the thickness direction at a bump thickness of 19 μm.

In view of this, strain on the crystal resonator 1 according to this embodiment was calculated over a distance d of 0.01 mm to 0.40 mm. It is assumed that the distance d is a distance (see the arrow in FIG. 3) between an outer periphery end edge 66 of the external connection terminal 6 and an outer periphery end edge 72 of the bump 7 along the attenuating direction A of stress. The results are shown in FIGS. 4 and 5. The thickness of the bump 7 is set at 38 μm in the calculation shown in FIG. 4, while the thickness of the bump 7 is set at 19 μm in the calculation shown in FIG. 5.

With the thickness of the bump 7 set at 38 μm as shown in FIG. 4, when the distance d is more than 0.00 mm and equal to or less than 0.12 mm, the strain is constantly positive, without reversal. Thus, setting the distance d at equal to or less than 0.12 mm minimizes the advancement of a crack on the solder caused by the positive-negative reversal of strain. Additionally, when the distance d is equal to or more than 0.06 mm and equal to or less than 0.12 mm, the strain is equal to or less than ±0.0005, thus minimizing the strain itself. Thus, setting the distance d at equal to or more than 0.06 mm and equal to or less than 0.12 mm minimizes the amount of cracks caused by strain. It is particularly preferred that the distance d is 0.12 mm, in which case the positive-negative reversal of strain is eliminated, and a long distance d is ensured.

With the thickness of the bump 7 set at 19 μm as shown in FIG. 5, when the distance d is more than 0.00 mm and equal to or less than 0.12 mm, the strain is constantly positive, without reversal. Thus, setting the distance d at equal to or less than 0.12 mm minimizes the advancement of a crack on the solder caused by the positive-negative reversal of strain. Additionally, when the distance d is equal to or more than 0.06 mm and equal to or less than 0.12 mm, the strain is equal to or less than ±0.0005, thus minimizing the strain itself. Thus, setting the distance d at equal to or more than 0.06 mm and equal to or less than 0.12 mm minimizes the amount of cracks caused by strain. It is particularly preferred that the distance d is 0.12 mm, in which case the positive-negative reversal of strain is eliminated, and a long distance d is ensured.

Thus, FIGS. 4 and 5 indicate that no matter how thick the bump 7 is, the stress in the thickness direction over the distance d results in similar tendencies. Hence, regardless of the thickness of the bump 7, the distance d is preferably equal to or less than 0.12 mm, and more preferably, the distance d is equal to or more than 0.06 mm and equal to or less than 0.12 mm. Regarding the strain, this embodiment with the bumps 7 ensures that the distance of positive-negative reversal is extended to equal to or more than 1.5 times as compared with the conventional art without the bumps 7. Hence, the conventional art without the bumps 7 will encounter significant failures associated with the positive-negative reversal of strain. Regarding the strain-associated failures, a crack generally occurs and advances in a positive strain area (in relation to the distance from the outer periphery end edge 66 of the external connection terminal 6). The positive strain turns into negative upon reversal of temperature. Meanwhile, the formerly negative strain area before the reversal of temperature turns into positive upon reversal of temperature, so that the crack advances in the positive turned area. The shorter the distance becomes between the area where the strain turns into positive and the area where the strain turns into negative, the more intensely the crack advances upon reversal of temperature at the time of thermal shock, thus increasing the rate of crack advancement. Thus, the positive-negative reversal of strain relates to the failures encountered in the conventional art.

Figure 6:
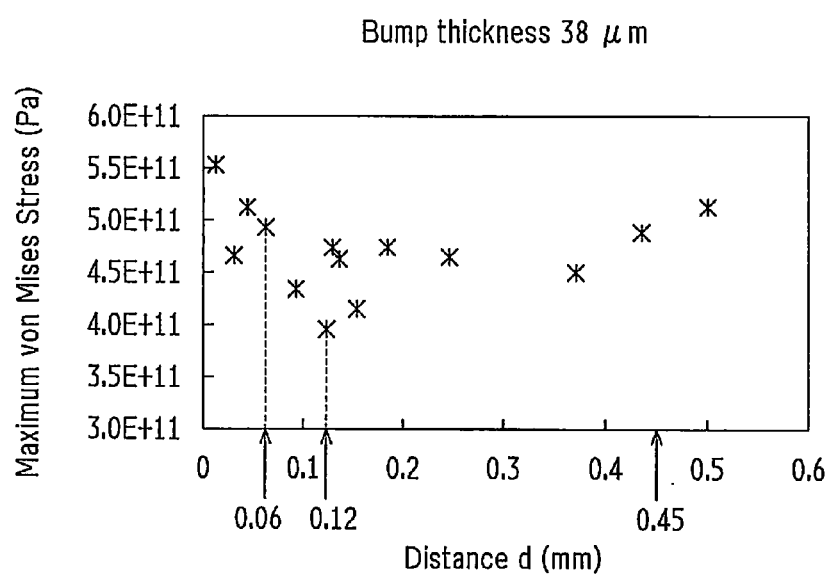
FIG. 6 is a graph illustrating a relationship between the distance d and Maximum von Mises Stress at a bump thickness of 38 μm.
Figure 7:
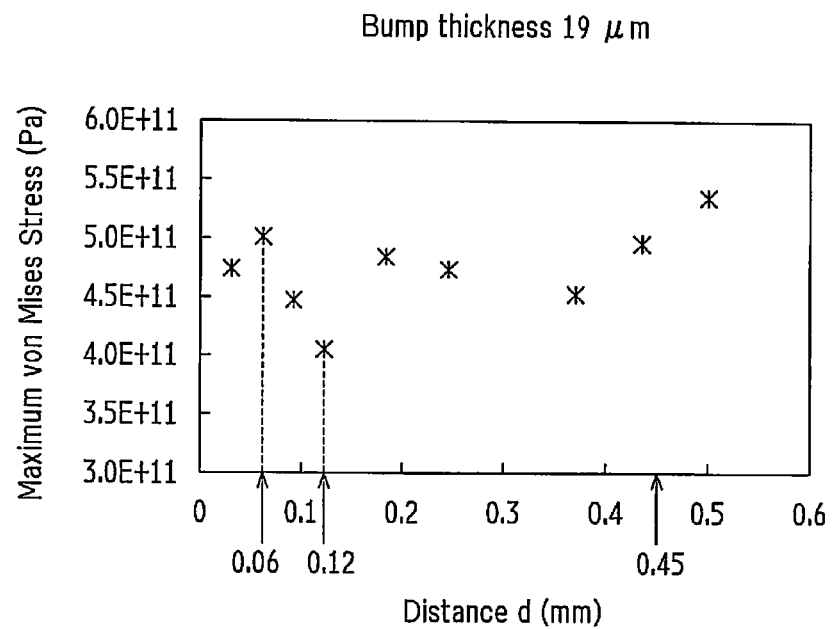
FIG. 7 is a graph illustrating a relationship between the distance d and Maximum von Mises Stress at a bump thickness of 19 μm.

Next, Maximum von Mises Stress was calculated at a distance d of equal to or more than 0.01 mm and equal to or less than 0.45 mm. The results are shown in FIGS. 6 and 7. The thickness of the bump 7 is set at 38 μm in the calculation shown FIG. 6, while the thickness of the bump 7 is set at 19 μm in the calculation shown FIG. 7.

With the thickness of the bump 7 set at 38 μm as shown in FIG. 6, when the distance d is equal to or more than 0.06 mm and equal to or less than 0.45 mm, the Maximum von Mises Stress is kept at equal to or less than 5.00E+11 Pa. Thus, the Maximum von Mises Stress is small in the above range, and the reduction in Maximum von Mises Stress reduces the amount of cracks. In particular, the Maximum von Mises Stress is minimized at a distance d of 0.12 mm.

With the thickness of the bump 7 set at 19 μm as shown in FIG. 7, when the distance d is equal to or more than 0.06 mm and equal to or less than 0.45 mm, the Maximum von Mises Stress is kept at equal to or less than 5.00E+11 Pa. Thus, the Maximum von Mises Stress is small in the above range, and the reduction in Maximum von Mises Stress reduces the amount of cracks. In particular, the Maximum von Mises Stress is minimized at a distance d of 0.12 mm.

The crystal resonator 1 according to this embodiment will be used in electronic devices of automotive applications that assume severe, high and low temperature environments. In view of this, a thermal shock test (a temperature change test), which involves temperature changes, was carried out. The thermal shock test was carried out to test the electrical connectivity between the crystal resonator 1 (package 11) and the circuit board 81 in a plurality of predetermined temperature environments. Specifically, the thermal shock test was carried out at a high temperature (+125° C.) and a low temperature (−55° C.). A change of temperature from the high temperature (+125° C.) to the low temperature (−55° C.) or from the low temperature to the high temperature was assumed one cycle. The test was to see up to what cycles the crystal resonator 1 (package 11) kept electrically connected to the circuit board 81. The thermal shock test shows that when the distance d shown in FIGS. 6 and 7 is 0.45 mm, 2000 cycles are accomplished. When the distance d shown in FIGS. 6 and 7 is 0.12 mm, 3000 cycles are accomplished in the thermal shock test involving temperature changes.

Thus, FIGS. 6 and 7 indicate that no matter how thick the bump 7 is, the Maximum von Mises Stress in the thickness direction over the distance d results in similar tendencies. Hence, regardless of the thickness of the bump 7, the distance d is preferably equal to or more than 0.06 mm and equal to or less than 0.45 mm. As described above, the Maximum von Mises Stress is minimized at a distance d of 0.12 mm.

FIGS. 4 to 7 indicate that the distance d is particularly preferably equal to or more than 0.06 mm and equal to or less than 0.12 mm. This eliminates the positive-negative reversal of strain to thereby minimize the advancement of a crack on the solder 82, which would otherwise advance due to the positive-negative reversal of strain. This also keeps the Maximum von Mises Stress at equal to or less than 5.00E+11 Pa. The reduction in Maximum von Mises Stress minimizes the amount of cracks. Additionally, the strain and the Maximum von Mises Stress are minimized at a distance d of 0.12 mm.

Next, while the thickness of the bump 7 was varied, the distance d of strain reversal relative to the thickness of the bump 7 was measured.

When the thickness of the bump 7 is 38 μm, the distance d is 0.12 mm. It is assumed that an imaginary line L passes on the outer periphery end edge 66 of the external connection terminal 6 and the outer periphery end edge 72 of the bump 7. The angle of the imaginary line L (hereinafter referred to as "bump angle") relative to a surface of the external connection terminal 6 is 18° when the thickness of the bump 7 is 38 μm and at a distance d of 0.12 mm. When the thickness of the bump 7 is 19 μm, the distance d is 0.11 mm, and the bump angle is 10°. When the thickness of the bump 7 is 0.013 mm, the distance d is 0.0922 mm, and the bump angle is 8°. Thus, at a distance d of equal to or more than 0.0922 mm and equal to or less than 0.12 mm, the bump angle is preferably equal to or more than 8° and equal to or less than 18°. Keeping the relationship between the distance d and the bump angle within this range eliminates the positive-negative reversal of strain. Hence, the range is suitable for minimizing the advancement of a crack on the solder, which would otherwise advance due to the positive-negative reversal of strain.

With the crystal resonator 1 according to this embodiment, the external connection terminals 6 to be electrically connected to the circuit board 81 with the solder 82 are formed on the other principal surface 32 of the base 3. The bumps 7 smaller than the external connection terminals 6 are formed on the respective external connection terminals 6. The distance d along the attenuating direction A of stress is set at more than 0.00 mm and equal to or less than 0.45 mm. This improves the durability of the solder 82 and minimizes the electrical disconnection of the package 11 from the circuit board 81.

Specifically, with the crystal resonator 1 according to this embodiment, forming each bump 7 on its corresponding external connection terminal 6 ensures that even if a crack occurs on the solder 82, the crack on the solder 82 does not develop along the external connection terminal 6 of the base 3, but instead develops from the outer periphery end edge 66 of the external connection terminal 6 toward the outer periphery end edge 72 of the bump 7 (see the arrow in FIG. 3). Thus, a bending point is ensured where the crack is bent in its course. The bending point impedes the advancement of a crack itself. This ensures that even if a crack occurs on the solder 82, the electrical disconnection of the base 3 from the circuit board 81 is more securely minimized as compared with the conventional art without the bumps 7. This, as a result, improves the durability of the solder 82. This configuration also ensures that the distance of positive-negative reversal of the direction of strain is extended to equal to or more than 1.5 times as compared with the conventional art without the bumps 7. This, as a result, reduces the rate of advancement of a crack on the solder 82 and minimizes cracking on the solder 82, which would otherwise advance due to the positive-negative reversal of strain.

Additionally, the package 11 of the crystal resonator 1 according to this embodiment includes the base 3 according to this embodiment and the lid 4. The package 11 is to be mounted on the circuit board 81. This ensures the advantageous effects of the base 3 according to this embodiment.

The external connection terminals 6 are disposed at diagonal positions among the four corners 36 of the other principal surface 32 of the base 3. The attenuating direction A of stress on each of the external connection terminals 6 is oriented from the corner portion 64 of the external connection terminal 6 disposed at a corner 36 of the other principal surface 32 of the base 3 toward the diagonal portion 65 disposed at a diagonal position relative to the corner portion 64. That is, this embodiment, in which the external connection terminals 6 are disposed diagonally on the other principal surface 32 of the base 3, ensures that even if a difference in coefficients of thermal expansion exists between the base 3 and the circuit board 81, the base 3 rotates about the center point 38 of the other principal surface 32 to uniformly distribute the stress.

Since the base 3 (a ceramic material) and the circuit board 81 (a glass epoxy material) have different coefficients of thermal expansion, a crack is likely to occur on the solder 82. Still, even if a crack occurs on the solder 82, the electrical disconnection of the base 3 from the circuit board 81 is more securely minimized as compared with the conventional art without the bumps 7. This, as a result, improves the durability of the solder 82. That is, the advantageous effects of this embodiment are particularly noticeable with the base 3 and the circuit board 81 having different coefficients of thermal expansion.

While in this embodiment the crystal resonator piece 2 uses an AT-Cut quartz crystal piece, this should not be construed in a limiting sense. It is possible to use crystal resonator pieces of other forms such as a tuning-fork crystal resonator piece.

While in this embodiment glass is used as the sealing material of the base 3, this should not be construed in a limiting sense. If the lid 4 is a metal lid, the sealing material 12 may include a metallized film of tungsten, molybdenum, or the like with a Ni plating layer and a Au plating layer covering the top face of the metallized film. Further, a metal ring may be formed over the plating layers.

While in this embodiment a ceramic material is used as the lid 4, this should not be construed in a limiting sense; it is also possible to use a glass material or a metal material. The method of hermetic sealing of the base 3 and the lid 4 is not limited to fusion bonding. It is also possible to use other methods such as welding joint and brazing, depending on the materials (of the base 3, the lid 4, the sealing material 12 or the like).

While in this embodiment each external connection terminal 6 has 1.2×1.5 mm dimensions in plan view and each bump 7 has 1.0×1.3 mm dimensions in plan view, this should not be construed in a limiting sense. The external connection terminal 6 and the bump 7 may be set at any dimensions insofar as the distance d is set in the range of 0.01 mm to 0.45 mm.

Figure 8:
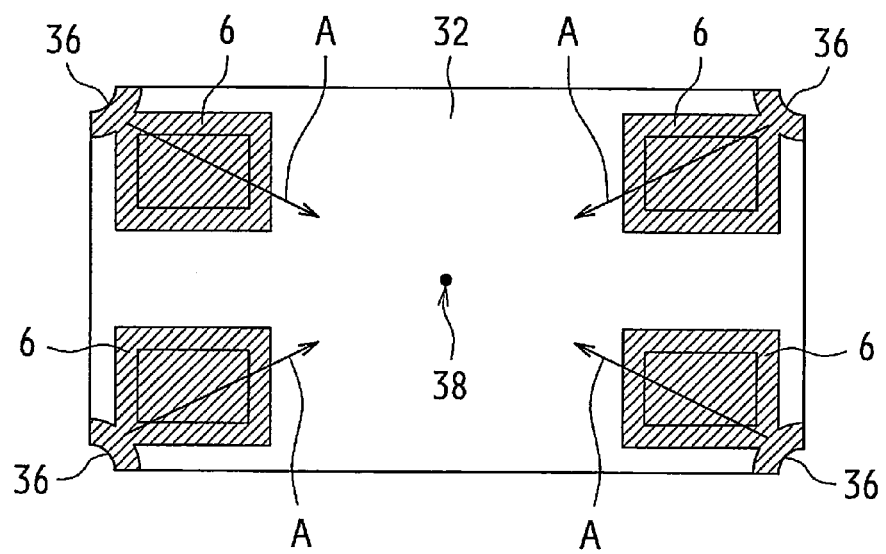
FIG. 8 is a schematic rear view of a package according to yet another embodiment of the present invention.

While in this embodiment two external connection terminals 6 are disposed at diagonal positions among the four corners of the other principal surface 32 of the base 3, this should not be construed in a limiting sense. As shown in FIG. 8, external connection terminals 6 may be disposed at all of the four corners 36 of the other principal surface 32 of the base 3. This is a four-terminal configuration that includes four external connection terminals 6 formed at the four corners 36, and the attenuating direction A of stress on each of the external connection terminals 6 is oriented from each corner 36 toward the center (the center point 38) of the other principal surface 32 of the base 3 (see the arrows in FIG. 8).

Figure 9:
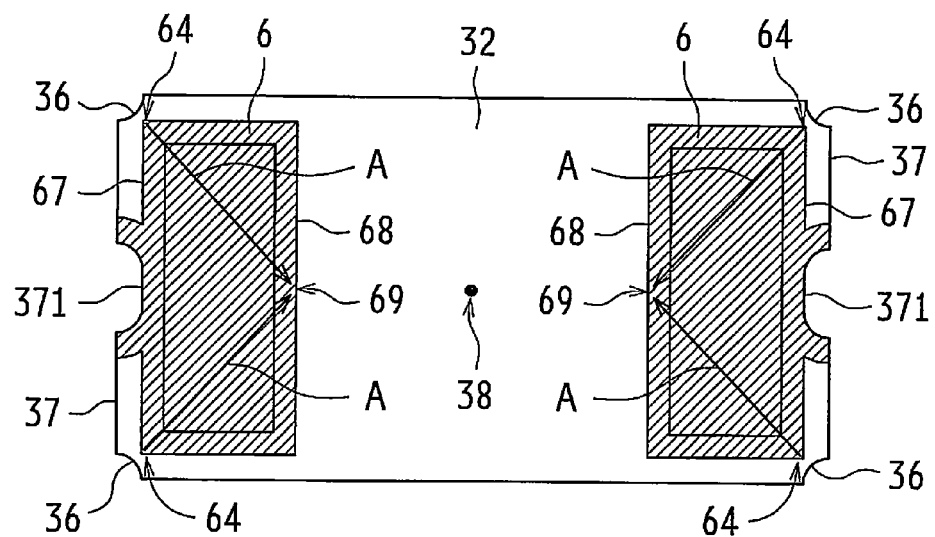
FIG. 9 is a schematic rear view of a package according to yet another embodiment of the present invention.

While in this embodiment two external connection terminals 6 are disposed at diagonal positions among the four corners 36 of the other principal surface 32 of the base 3, this should not be construed in a limiting sense. As shown in FIG. 9, a pair of external connection terminals 6 may be disposed in an opposing manner along a pair of respective shorter sides 37 on the other principal surface 32 of the base 3.

The configuration shown in FIG. 9 is a two-terminal configuration that includes: two opposing external connection terminals 6 along the pair of respective shorter sides 37 of the base 3; and castellations on the respective center positions 371 of the shorter sides 37. The attenuating direction A of stress on each of the external connection terminals 6 is oriented from a corner portion 64 of each external connection terminal 6, which is closest to a corner 36 of the other principal surface 32 of the base 3, toward a center position 69 of an opposing side 68 facing a side 67, on which the corner portion 64 of the external connection terminal 6 is formed (see the arrows in FIG. 9). That is, the attenuating direction A of stress shown in FIG. 9 is oriented from the corner portion 64 of the external connection terminal 6, which is closest to a corner of the other principal surface 32, toward the side (the opposing side 68) of the external connection terminal 6 closest to the center point 38 of the other principal surface 32.

With the configuration shown in FIG. 9, symmetrically disposing the external connection terminals 6 on the other principal surface 32 of the base 3 minimizes occurrence of stress on the other principal surface 32 of the base 3. This alleviates the influence of the difference in coefficients of thermal expansion. This, as a result, minimizes occurrence of a crack itself.

Figure 10:
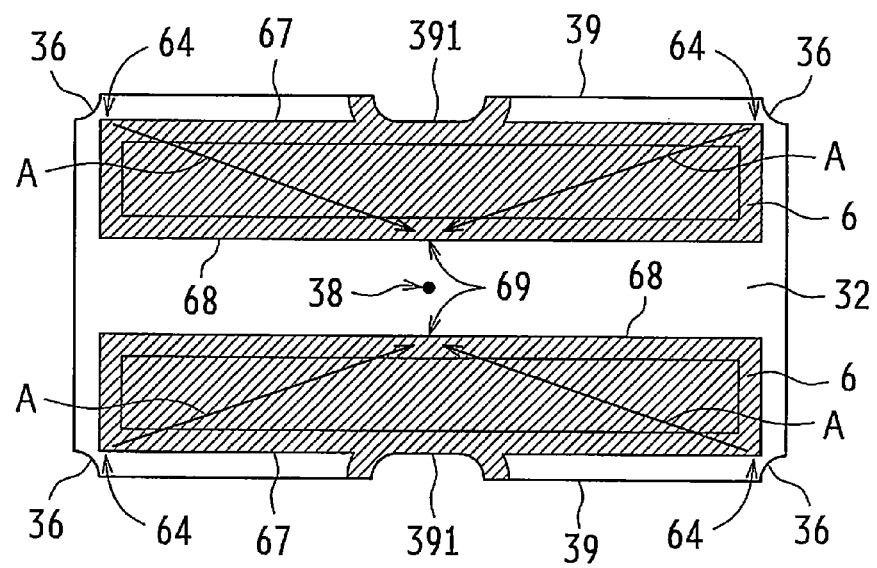
FIG. 10 is a schematic rear view of a package according to yet another embodiment of the present invention.

While two external connection terminals 6 are disposed at diagonal positions among the four corners 36 of the other principal surface 32 of the base 3, this should not be construed in a limiting sense. As shown in FIG. 10, a pair of external connection terminals 6 may be disposed in an opposing manner along a pair of respective longer sides 39 on the other principal surface 32 of the base 3.

The configuration shown in FIG. 10 is a two-terminal configuration that includes: two opposing external connection terminals 6 along the pair of respective longer sides 39 of the base 3; and castellations on the respective center positions 391 of the longer sides 39. The attenuating direction A of stress on each of the external connection terminals 6 is oriented from a corner portion 64 of each external connection terminal 6, which is closest to a corner 36 of the other principal surface 32 of the base 3, toward a center position 69 of an opposing side 68 facing a side 67, on which the corner portion 64 of the external connection terminal 6 is formed (see the arrows in FIG. 10). That is, the attenuating direction A of stress shown in FIG. 10 is oriented from the corner portion 64 of the external connection terminal 6, which is closest to a corner of the other principal surface 32, toward the side (the opposing side 68) of the external connection terminal 6 closest to the center point 38 of the other principal surface 32.

The configuration shown in FIG. 10 more effectively minimizes occurrence of stress in the longer side direction of the other principal surface 32 of the base 3, where the influence of the difference in coefficients of thermal expansion is large. This adds to the advantageous effects of the two-terminal configuration of opposition across the shorter sides shown in FIG. 9. This leads to alleviation of the influence of the difference in coefficients of thermal expansion in the shorter side direction of the other principal surface 32 of the base 3. This, as a result, more securely minimizes occurrence of a crack itself.

In the configurations shown in FIGS. 9 and 10, each external connection terminal 6 has a dimension that is more than half a side (the shorter side 37 or the longer side 39) of the base 3. Setting a dimension of each external connection terminal 6 at equal to or more than 70% of a side of the base 3 (the shorter side 37 or the longer side 39) minimizes occurrence of stress in the corresponding side direction.

While in this embodiment the surface 63 of the external connection terminal 6 and the surface 71 of the bump 7 are flat and oriented in the same direction, this should not be construed as limiting the shapes of the external connection terminals 6 and the bumps 7. The bump 7 may be shaped such that the thickness of the bump 7 increases along the attenuating direction A of stress. Specifically, the surface 71 of the bump 7 may be tapered relative to the surface 63 of the external connection terminal 6, or the surface 71 of the bump 7 may be curved. With this configuration, the increasing thickness of the bump 7 along the attenuating direction A of stress causes a crack to develop not along the surface 63 of the external connection terminal 6 but along the surface 71 of the bump 7. This ensures that even if a crack occurs on the solder 82, the electrical disconnection of the base 3 from the circuit board 81 is minimized as compared with the conventional art without the bumps 7. This, as a result, improves the durability of the solder 82.

While in this embodiment the crystal resonator piece 2 has an outer shape in the form of a rectangular parallelepiped plate, this should not be construed in a limiting sense. The areas in which the excitation electrodes are to be formed and which thus resonate may be thinner so as to adapt to high frequency applications.

Figure 11:
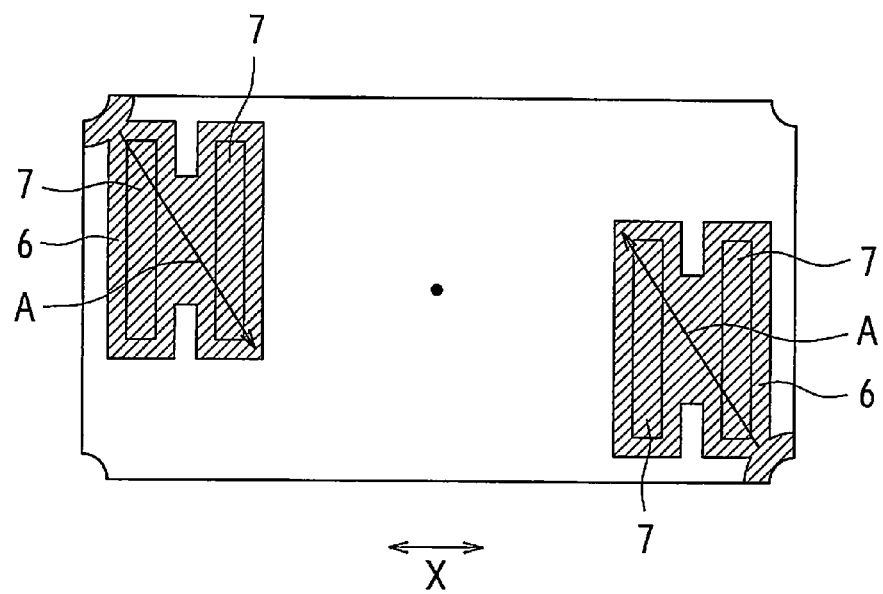
FIG. 11 is a schematic rear view of a package according to yet another embodiment of the present invention.

While in this embodiment each external connection terminal 6 is in the form of a rectangular parallelepiped and each bump 7 is in the form of a rectangular parallelepiped on the external connection terminal 6, this should not be construed in a limiting sense. For example, as shown in FIG. 11, each external connection terminal 6 may be formed in an H shape in plan view, and two rectangular parallelepiped bumps 7 may be formed on each external connection terminal 6. The two rectangular parallelepiped bumps 7 shown in FIG. 11 are aligned along the X direction (the longer side direction of the base 3 and the shorter side direction of the external connection terminal 6) in the same orientation. The two bumps 7 are disposed on the attenuating direction A of stress. With the configuration of the external connection terminal 6 and the bumps 7 shown in FIG. 11, the two bumps 7 are disposed on the attenuating direction A of stress. This further improves the durability of the solder 82 as compared with the above embodiment. Specifically, with the configuration shown in FIG. 11, disposing the two bumps 7 on the attenuating direction A of stress on the external connection terminal 6 ensures that even if a crack occurs on the solder 82, the crack on the solder 82 does not develop along the external connection terminal 6 of the base 3, but instead develops from the outer periphery end edge 66 of the external connection terminal 6 toward the outer periphery end edge 72 of the bump 7 (see the arrow in FIG. 3). Thus, two bending points are ensured where the crack is bent in its course. The two bending points impede the advancement of a crack itself. This ensures that even if a crack occurs on the solder 82, the electrical disconnection of the base 3 from the circuit board 81 is more securely minimized as compared with the above embodiment with the single bump 7.

Figure 12:
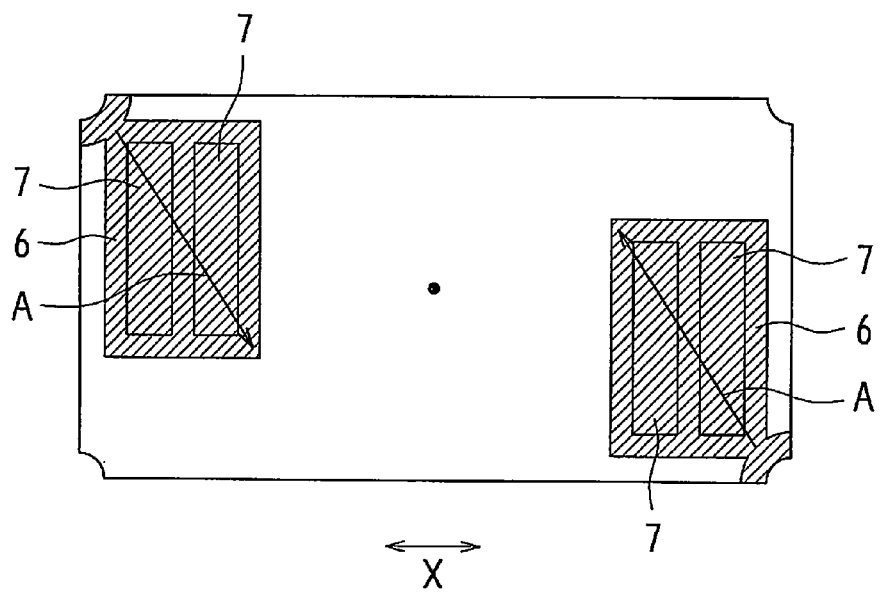
FIG. 12 is a schematic rear view of a package according to yet another embodiment of the present invention.

As shown in FIG. 12, which is a different configuration from the configuration in FIG. 11, each external connection terminal 6 may be formed in a rectangular parallelepiped shape, and two rectangular parallelepiped bumps 7 may be formed on each external connection terminal 6. The two rectangular parallelepiped bumps 7 shown in FIG. 12 are aligned along the X direction (the longer side direction of the base 3 and the shorter side direction of the external connection terminal 6) in the same orientation. The two bumps 7 are disposed on the attenuating direction A of stress. The two bumps 7 are disposed on the attenuating direction A of stress. The configuration shown in FIG. 12 provides similar advantageous effects as those of the configuration in FIG. 11.

Figure 13:
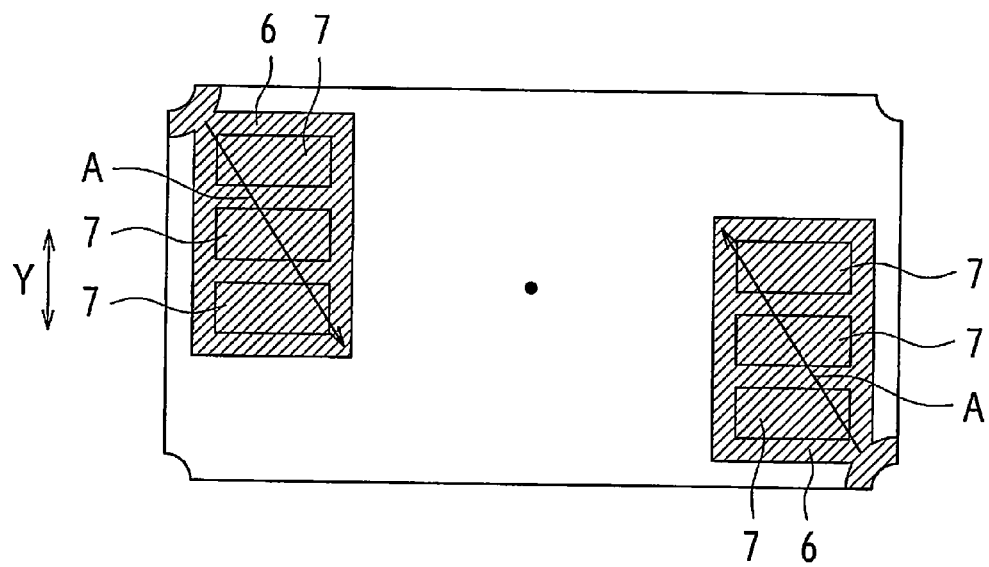
FIG. 13 is a schematic rear view of a package according to yet another embodiment of the present invention.

As shown in FIG. 13, which is a different configuration from the configuration in FIG. 11, each external connection terminal 6 may be formed in a rectangular parallelepiped shape, and three rectangular parallelepiped bumps 7 may be formed on each external connection terminal 6. The three rectangular parallelepiped bumps 7 shown in FIG. 13 are aligned along the Y direction (the shorter side direction of the base 3 and the longer side direction of the external connection terminal 6) in the same orientation. The three bumps 7 are disposed on the attenuating direction A of stress. Since the number of the bumps 7 is higher in the configuration in FIG. 13 than in the configuration in FIG. 11, the durability of the solder 82 further improves in the configuration in FIG. 13.

Figure 14:
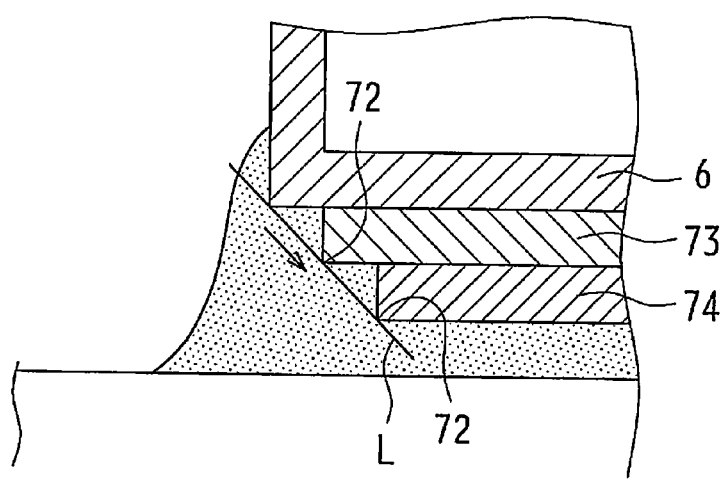
FIG. 14 is an enlarged view of a circuit board and a crystal resonator according to yet another embodiment corresponding to FIG. 3, illustrating a state of their bonding.

While in this embodiment the bump 7 having a single layer is formed (stacked) on the external connection terminal 6, this should not be construed in a limiting sense; the bump 7 may have a plurality of layers. It is particularly preferred that the plurality of layers are formed in a stepped manner in a cross-sectional view as shown in FIG. 14. The bump 7 shown in FIG. 14 includes two layers of bumps 73 and 74 formed on the external connection terminal 6 in this order. The bumps 73 and 74 have their outer periphery end edges aligned on the attenuating direction A of stress (see the imaginary line L in FIG. 14) in this order. Thus, the bumps 73 and 74 are formed in a stepped manner in a cross-sectional view as shown in FIG. 14. Disposing the bumps 73 and 74 shown in FIG. 14 on the external connection terminal 6 extends the distance over which a crack develops along the imaginary line L as compared with the above embodiment, and more securely impedes the advancement of a crack along the external connection terminal 6.

While in the above embodiments the outer periphery end edge 72 of each of the bumps 7, 73, and 74 forms a right angle as shown in FIGS. 3 and 14, this should not be construed in a limiting sense. The outer periphery end edge 72 of each of the bumps 7, 73, and 74 may be tapered or curved.

The present invention can be embodied and practiced in other different forms without departing from the spirit, scope, and essential characteristics of the present invention. Therefore, the above-described embodiments are considered in all respects as illustrative and not restrictive. The scope of the invention is indicated by the appended claims rather than by the foregoing description. All variations and modifications falling within the equivalency range of the appended claims are intended to be embraced therein.

This application claims priority to Patent Application No. 2010-085232 filed in Japan on Apr. 1, 2010, which is hereby incorporated by reference in its entirety by claiming the priority.

INDUSTRIAL APPLICABILITY

The electronic component package of the present invention is applicable to surface-mount electronic component packages.

REFERENCE SIGNS LIST

1 Crystal resonator
11 Package
12 Bonding material
2 Crystal resonator piece
21 One principal surface
22 The other principal surface
23 Side face
3 Base
31 One principal surface
32 The other principal surface
33 Cavity
34 Side face
35 Castellation
36 Corner
37 Shorter side
371 Center position
38 Center point 39 Longer side
391 Center position
4 Lid
5 Electrode
51 Electrode pad
52 Wiring pattern
6 External connection terminal
61 Opposing area
62 Non-opposing area
63 Surface
64 Corner portion
65 Diagonal portion
66 Outer periphery end edge
67 Side
68 Opposing side
69 Center position
7, 73, 74 Bump
71 Surface
72 Outer periphery end edge
81 Circuit substrate
82 Solder
A Attenuating direction of stress
d Distance
L Imaginary line

The invention claimed is:

1. A base of a surface-mount electronic component package to hold an electronic component element and to be mounted on a circuit board with a conductive bonding material, the base comprising:
a principal surface;
at least one external connection terminal to be electrically connected to the circuit board, the at least one external connection terminal being formed in the principal surface;
a bump formed on the at least one external connection terminal, the bump being smaller than the at least one external connection terminal; and
a distance d between an outer periphery end edge of the at least one external connection terminal and an outer periphery end edge of the bump along an attenuating direction of stress on the at least one external connection terminal, the stress being generated in association of mounting of the base on the circuit board, the stress attenuating along the attenuating direction of stress,
wherein the distance d is more than 0.00 mm and equal to or less than 0.45 mm.

2. The base of a surface-mount electronic component package according to claim 1, wherein the distance d is more than 0.00 mm and equal to or less than 0.12 mm.

3. The base of a surface-mount electronic component package according to claim 1, wherein the distance d is equal to or more than 0.06 mm and equal to or less than 0.45 mm.

4. The base of a surface-mount electronic component package according to claim 1, wherein the distance d is equal to or more than 0.06 mm and equal to or less than 0.12 mm.

5. The base of a surface-mount electronic component package according to claim 1,
wherein an imaginary line passes on the outer periphery end edge of the at least one external connection terminal and the outer periphery end edge of the bump, and
wherein an angle of the imaginary line relative to a surface of the at least one external connection terminal is in a range of 8° to 18°.

6. The base of a surface-mount electronic component package according to claim 1,
wherein the at least one external connection terminal comprises four external connection terminals respectively formed at four corners of the principal surface, and
wherein the attenuating direction of stress on each of the four external connection terminals is oriented from each of the four corners of the principal surface toward a center point of the principal surface.

7. The base of a surface-mount electronic component package according to claim 1,
wherein the at least one external connection terminal comprises a pair of opposing external connection terminals formed along a pair of respective sides of the principal surface, and
wherein the attenuating direction of stress on each of the pair of external connection terminals is oriented from a corner portion of each of the external connection terminals closest to a corner of the principal surface toward a side of each of the external connection terminals closest to a center point of the principal surface.

8. The base of a surface-mount electronic component package according to claim 1,
wherein the at least one external connection terminal comprises a pair of external connection terminals formed at respective diagonal positions of the principal surface, and
wherein the attenuating direction of stress on each of the pair of external connection terminals is oriented from a corner portion of each of the external connection terminals disposed at a corner of the principal surface toward a diagonal portion of each of the external connection terminals disposed at a diagonal position relative to the corner portion.

9. The base of a surface-mount electronic component package according to claim 1, wherein the bump has a thickness increasing along the attenuating direction of stress.

10. The base of a surface-mount electronic component package according to claim 1, wherein the base and the circuit board have different coefficients of thermal expansion.

11. A surface-mount electronic component package to be mounted on a circuit board, the surface-mount electronic component package comprising:
the base of a surface-mount electronic component package according to claim 1 to hermetically seal an electronic component element; and
a lid.

* * * * *